United States Patent
Masumoto et al.

[11] Patent Number: 5,825,085
[45] Date of Patent: Oct. 20, 1998

[54] POWER SEMICONDUCTOR DEVICE, ARMORING CASE THEREOF AND METHOD FOR MANUFACTURING THE SAME

[75] Inventors: Toshikazu Masumoto; Hisatoshi Arita, both of Tokyo, Japan

[73] Assignee: Mitsubishi Denki Kabushiki Kaisha, Tokyo, Japan

[21] Appl. No.: 615,052

[22] Filed: Mar. 12, 1996

[30] Foreign Application Priority Data

Sep. 1, 1995 [JP] Japan ..................................... 7-225159

[51] Int. Cl.$^6$ ....................................................... H01L 23/12
[52] U.S. Cl. ........................... 257/704; 257/723; 257/698
[58] Field of Search ................................... 257/704, 796, 257/723, 698, 683, 706, 724

[56] References Cited

U.S. PATENT DOCUMENTS 5,646,445  7/1997  Masumoto ............................... 257/723

FOREIGN PATENT DOCUMENTS

57-10952  1/1982  Japan .

Primary Examiner—Tom Thomas
Assistant Examiner—Roy Potter
Attorney, Agent, or Firm—Oblon, Spivak, McClelland, Maier & Neustadt, P.C.

[57] ABSTRACT

The present invention implements an armoring case of a power semiconductor device which can prevent cracks from occurring by inserting the terminal portion of an electrode plate in the inserting hole of the armoring case and then bending the same, misregistration from occurring between the fastening bolt inserting hole of the terminal portion and the screw portion of a terminal nut, and the like, and which can easily be assembled automatically. A terminal nut cover is previously molded. The terminal nut cover includes a first concave portion which can cover and support the terminal nut so as not to rotate when fastening a bolt, and a second concave portion into which the tip of the screw portion of the bolt can project. The electrode plate whose terminal portion is previously bent into a predetermined shape by a press machine or the like, and the terminal nut cover having the terminal nut inserted in and supported by the first concave portion are provided in a metal mold for the armoring case. The electrode plate and the terminal nut cover are insert-molded integrally with the armoring case, so that the armoring case of the power semiconductor device can be molded.

10 Claims, 7 Drawing Sheets

POWER SEMICONDUCTOR DEVICE, ARMORING CASE THEREOF AND METHOD FOR MANUFACTURING THE SAME

BACKGROUND OF THE INVENTION

1. Field of the Invention

The present invention relates to an armoring case of a power semiconductor device and a method for manufacturing the same, and more particularly to a method for manufacturing the armoring case integrally with terminal nuts and electrode plates by insert-molding.

2. Description of the Background Art

Figure 5:
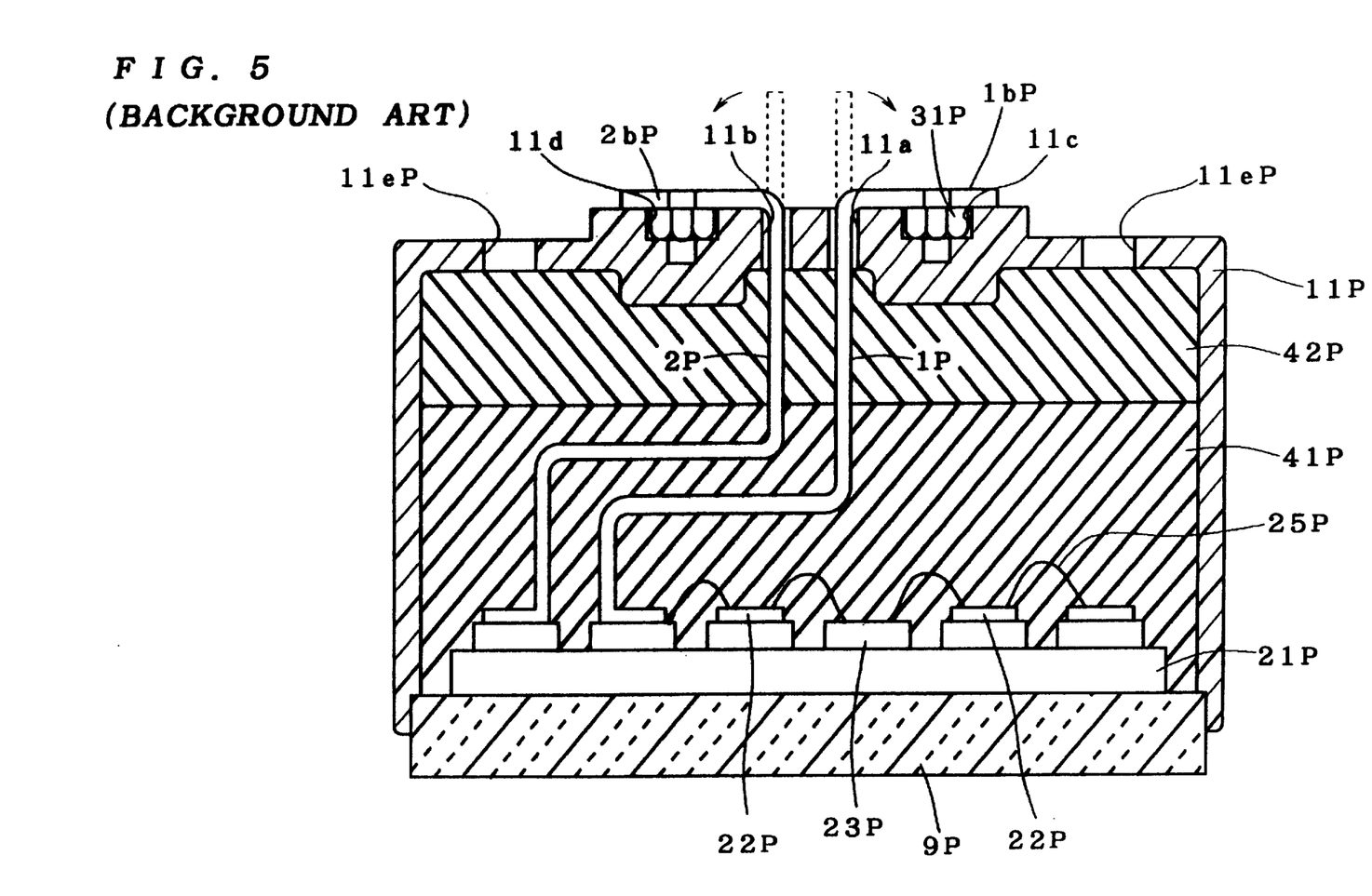
FIGS. 5 and 6 are sectional views showing the main part of a conventional power semiconductor device.
Figure 6:
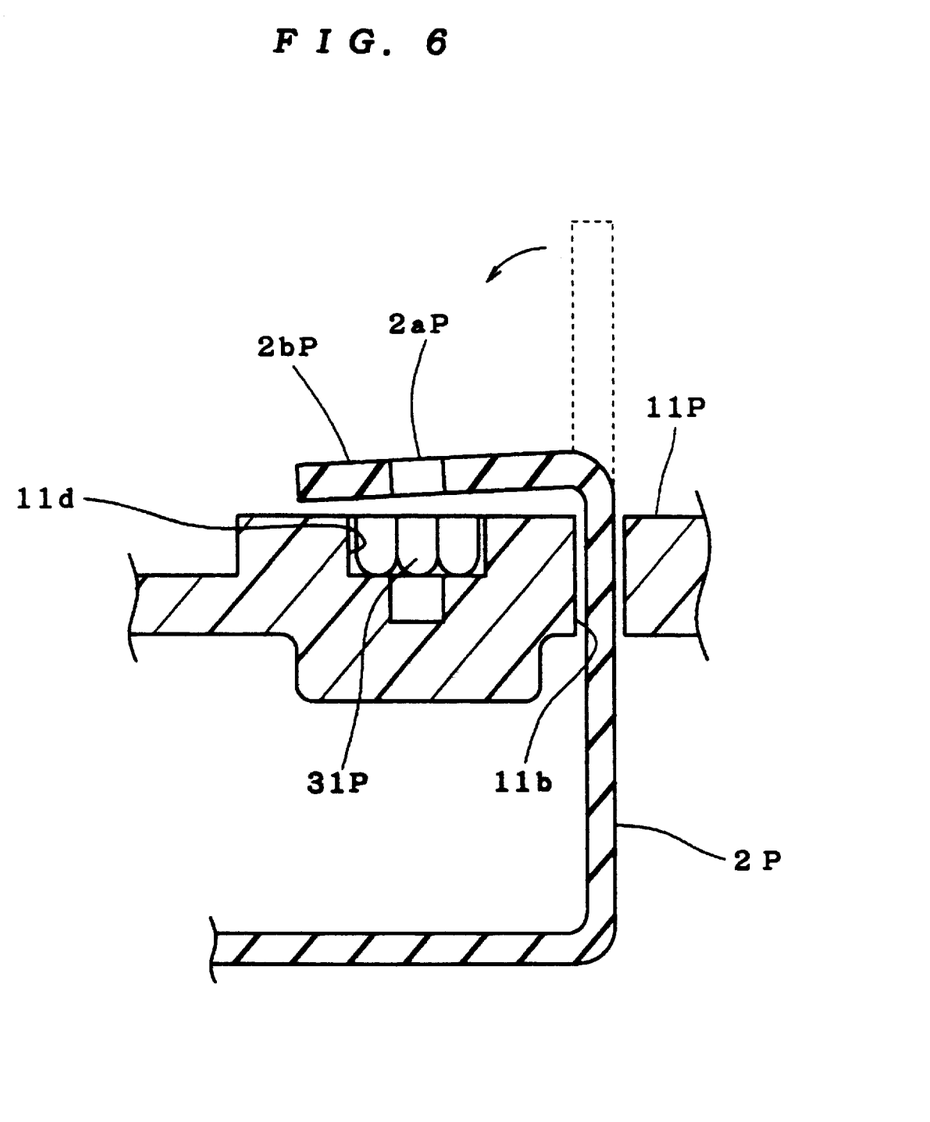

FIG. 5 is a longitudinally sectional view showing the structure of the main part of a conventional power semiconductor device. FIG. 6 is a longitudinally sectional view in which FIG. 5 is partially enlarged.

In FIGS. 5 and 6, each reference numeral designates the following. The reference numerals 1P and 2P designate electrode plates which have terminal portions 1bP and 2bP on the tip sides respectively. When the electrode plates 1P and 2P are molded, the terminal portions 1bP and 2bP are extended straight as shown in broken lines in FIG. 5 so as to easily be inserted in an armoring case 11P.

The reference numeral 9P designates a heat radiating plate for radiating heat outward. The reference numeral 11P designates an armoring case which is previously molded so as to have holes 11a and 11b for inserting the terminal portions 1bP and 2bP, holes 11c and 11d for inserting terminal nuts, and windows 11eP for injecting a silicone resin or an epoxy resin.

The terminal portions 1bP and 2bP of the electrode plates 1P and 2P are inserted in the terminal inserting holes 11a and 11b provided on the armoring case 11P, respectively. Two terminal nuts 31P are inserted in the terminal nut inserting holes 11c and 11d provided on the armoring case 11P, respectively. Then, the terminal portions 1bP and 2bP are bent in the predetermined directions shown by arrows in FIG. 5 so as to be almost horizontal relative to the top face of the armoring case 11P. Consequently, the armoring case 11P having the electrode plates and the terminal nuts are formed. The reference numeral 2aP shown in FIG. 6 is an external bolt inserting hole for inserting a fastening bolt, which is provided on the tip portion 2bP.

The reference numeral 21P designates a ceramic substrate as an insulating substrate. A circuit conductor foil 23P is connected onto the substrate 21P. The reference numeral 22P designates a power semiconductor element which is fixed to the circuit conductor foil 23P on the ceramic substrate 21P. The reference numeral 25P designates an aluminum wire. The reference numeral 31P designates a terminal nut for fastening the terminal portions 1bP and 2bP to connect them with corresponding external electrodes which are not shown. The reference numeral 41P designates a soft silicone resin for protecting the power semiconductor element 22P and the aluminum wire 25P which is connected by wiring. The reference numeral 42P designates a hard epoxy resin.

The schematic operation of a conventional power semiconductor device which is shown in FIG. 5 will be described below. The function obtained by the power semiconductor element 22P is transmitted to the electrode plates 1P and 2P through the aluminum wire 25P and the circuit conductor foil 23P connected to the insulating substrate 21P, and then transmitted to an external electrode provided separately (not shown) which is fastened by the terminal nut 31P and a fastening bolt provided outside the power semiconductor device (not shown). The heat generated by the power semiconductor element 22P is radiated to a cooling body (not shown) to which the power semiconductor device is fixed through the insulating substrate 21P having the circuit conductor foil 23P and the heat radiating plate 9P, and transmitted to the electrode plates 1P and 2P through the silicone resin 41P for protecting the power semiconductor element 22P and the aluminum wire 25P and then radiated upward.

When assembling the power semiconductor device, the following problems may be caused.

The armoring case 11P having the electrode plates 1P and 2P is formed prior to the step of assembling the power semiconductor device. The method for forming the armoring case 11P will be described with reference to FIG. 6. First of all, the terminal nut 31p and the electrode plate 2P are inserted in the terminal nut inserting hole 11d and the electrode plate inserting hole 11b of the armoring case 11P which is previously molded with a resin into a predetermined shape, respectively. Then, the terminal portion 2bP of the electrode plate 2P is bent at the subsequent step. In this case, it is impossible to provide a rigid body such as a metal mold between the terminal portion 2bP of the electrode plate 2P and the armoring case 11P to fold the terminal portion 2bP. For this reason, in the conventional bending step, cracks are caused due to bending stress on the armoring case 11P in the vicinity of the electrode plate inserting hole 11b. In addition, the bending precision of the terminal portion 2bP of the electrode plate 2P is poor, and fissures may be caused on the bent portion due to plating peeling. In particular, if the electrode plate 2P has a thickness of 1 mm or more, such problems may easily be caused.

In the conventional power semiconductor device, the following problems are caused when assembling the armoring case having the electrode plates.

(1) Cracks occur on the armoring case.

(2) The bending precision of the terminal portion of the electrode plate is poor so that misregistration occurs between the external bolt inserting hole provided on the terminal portion of the electrode plate and the screw hole of the terminal nut.

(3) Cracks occur on the terminal portion.

These problems are caused by bending the terminal portion of the electrode plate at the subsequent step.

SUMMARY OF THE INVENTION

In order to solve the problems described above, it is necessary to previously bend the terminal portions of the electrode plates so as to form an armoring case having the electrode plates by insert-molding. In this case, however, a resin for molding the armoring case invades the screw hole portion of the terminal nut so that the terminal nut does not fulfill original functions. For this reason, the present invention employs the following structure.

According to a first aspect of the present invention, a power semiconductor device comprises an armoring case. The armoring case includes a terminal nut, a terminal nut cover for covering at least a lower portion of an outer side and a bottom of the terminal nut and for supporting the terminal nut so as to prevent the terminal nut from rotating, and an electrode plate including a terminal portion which is previously bent into a predetermined shape and has a bolt inserting hole for inserting an external bolt so as to be threadingly engaged in the terminal nut, the bolt inserting hole having a central axis conforming to a central axis of a screw hole of the terminal nut, wherein the terminal nut cover and the electrode plate are insert-molded integrally with the armoring case.

According to a second aspect of the present invention, an armoring case of a power semiconductor device comprises a terminal nut cover for covering at least a lower portion of an outer side and a bottom of a terminal nut and for supporting the terminal nut so as to prevent the terminal nut from rotating, and an electrode plate including a terminal portion which is previously bent into a predetermined shape and has a bolt inserting hole for inserting an external bolt so as to be threadingly engaged in the terminal nut, the bolt inserting hole having a central axis conforming to a central axis of a screw hole of the terminal nut, wherein the terminal nut cover and the electrode plate are insert-molded integrally with the armoring case.

According to a third aspect of the present invention, a method for manufacturing an armoring case of a power semiconductor device comprises the steps of preparing a terminal nut, preparing a terminal nut cover for covering at least a lower portion of an outer side and a bottom of the terminal nut and for supporting the terminal nut so as to prevent the terminal nut from rotating, preparing an electrode plate including a terminal portion which is previously bent into a predetermined shape and has a bolt inserting hole for inserting an external bolt so as to be threadingly engaged in the terminal nut, preparing a metal mold for the armoring case, the metal mold having positions where the terminal nut cover and the electrode plate should be provided so that a central axis of the bolt inserting hole of the electrode plate conforms to a central axis of the screw hole of the terminal nut which is supported by the terminal nut cover, and providing the terminal nut cover in the corresponding position in the metal mold to support the terminal nut by the terminal nut cover, and providing the electrode plate in the corresponding position in the metal mold to insert-mold the terminal nut cover and the electrode plate integrally with the armoring case.

The terminal nut cover provided in the armoring case of the power semiconductor device according to the present invention prevents a mold resin from invading the screw hole portion of the terminal nut and prevents the terminal nut from rotating therein during insert-molding. According to such a structure, the terminal portion of the electrode plate can be exactly bent at the previous step. Consequently, cracks are not caused on the armoring case but the bending precision of the terminal portion of the electrode plate can be enhanced.

The terminal nut cover has such a shape as to be easily fixed to the armoring case. In addition, the positional precision of the terminal nut cover can readily be enhanced when molding the armoring case.

It is a first object of the present invention to provide an armoring case of a power semiconductor device which can solve all of these problems (1) to (3), can prevent a mold resin from invading the screw hole portion of a terminal nut during insert-molding, and can prevent the terminal nut from rotating when fastening with the same and an external bolt.

It is a second object of the present invention to easily assemble the peripheral portion of the terminal automatically and prevent the terminal nut from rotating more surely to enhance the precision in armoring case molding.

BRIEF DESCRIPTION OF THE DRAWINGS

These and other objects, features, aspects and advantages of the present invention will become more apparent from the following detailed description of the present invention when taken in conjunction with the accompanying drawings, wherein.

DESCRIPTION OF THE PREFERRED EMBODIMENTS (First Preferred Embodiment)

Figure 1:
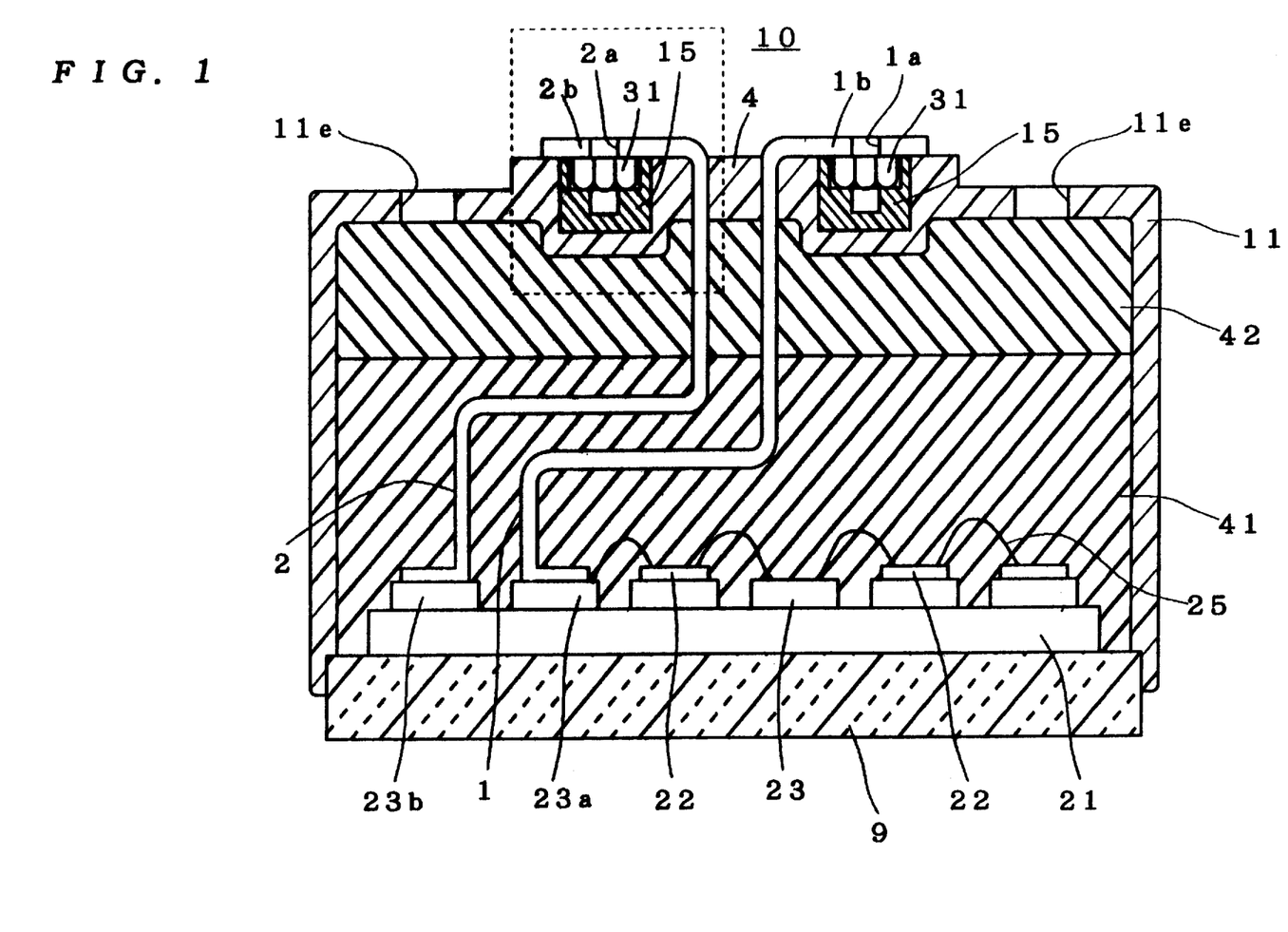
FIG. 1 is a sectional view showing the main part of a power semiconductor device according to a first preferred embodiment of the present invention.
Figure 2:
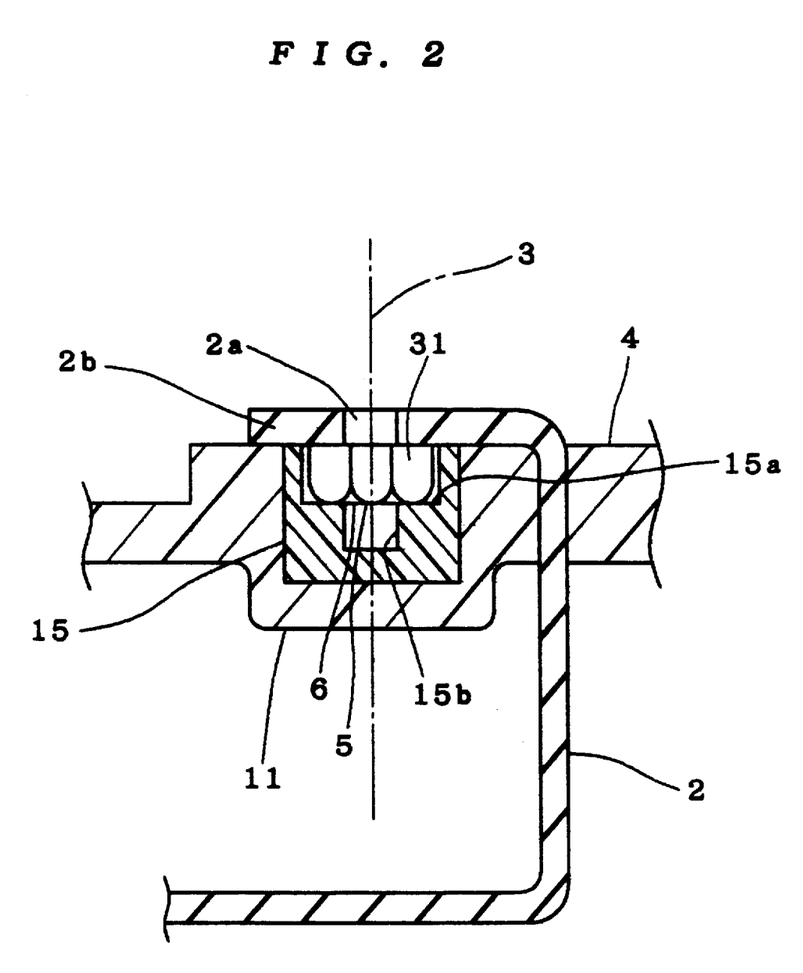
FIG. 2 is a sectional view showing the main part of the armoring case of the power semiconductor device according to the first preferred embodiment of the present invention.

FIG. 1 is a longitudinally sectional view showing the structure of the main part of a power semiconductor device according to a first preferred embodiment of the present invention. FIG. 2 is a longitudinally sectional view showing the structure of the main part of the armoring case of the power semiconductor device, which enlarges a portion surrounded by broken lines shown in FIG. 1.

In FIG. 1, the reference numeral 21 designates an insulating substrate, for example, a ceramic substrate. Circuit conductor foils 23 are provided on a top face of the insulating substrate 21. Power semiconductor elements 22 are fixed onto the top faces of some circuit conductor foils 23. Aluminum wires 25 are connected between respective electrodes of the power semiconductor elements 22 and respective other circuit conductor foils 23. The one end of electrode plates 1 and 2 which will be described below are fixed to the circuit conductor foils 23a and 23b, respectively. A heat radiating plate 9 is fixedly provided on the lower face of the insulating substrate 21. The heat radiating plate 9 outward radiates the heat generated by the power semiconductor elements 22.

An active body which includes the members 9, 21, 22, 23 and 25 is covered with an armoring case 11. A silicone resin 41 and an epoxy resin 42 are sequentially injected into the armoring case 11 through injecting windows 11e provided on the armoring case 11, so that a power semiconductor device 10 is sealed with resins.

The armoring case 11 which is formed of a resin is the main part of the present invention, and comprises electrode plates 1 and 2, terminal nuts 31 and terminal nut covers 15. The terminal nuts 31 are threadingly engaged in corresponding external bolts (not shown) through the electrode plates 1 and 2, respectively. Each of the terminal nut covers 15 covers at least the lower portion of the outer side and the bottom of the corresponding terminal nut 31 to thereby support the terminal nut 31 so as to prevent the same from rotating. The armoring case 11 is insert-molded integrally with the members 1, 2 and 15. As will be described below, the armoring case 11 is molded prior to the steps of assembling the power semiconductor device 10 and sealing the same with resins. The structure of the armoring case 11 will be described in detail.

The electrode plates 1 and 2 have terminal portions 1b and 2b which are previously bent into a predetermined shape with high precision by a press machine or the like, respectively. In this preferred embodiment, the terminal portions 1b and 2b are previously bent into an L-shape so as to be arranged horizontally relative to an upper face 4 of the armoring case 11 after molding. Bolt inserting holes 1a and 2a for inserting external fastening bolts are previously formed in the respective predetermined positions of the terminal portions 1b and 2b. The electrode plates 1 and 2 are provided in the respective predetermined positions of a metal mold for insert-molding (not shown) in such a manner that the central axes of the bolt inserting holes 1a and 2a conform to the central axis of the screw holes (not shown) of the terminal nuts 31 after the armoring case 11 is molded.

Each of the terminal nut covers 15 is a resin body which is previously molded, and includes a connecting two-stage concave portion comprised of a first concave portion 15a and a second concave portion 15b. The first concave portion 15a is a terminal nut inserting hole which has an opening on the inserting face 4 side for the terminal nut 31 of the armoring case 11. The second concave portion 15b is formed from an opening 5 provided on the bottom of the first concave portion 15a toward the inside.

The first concave portion 15a has the same shape and dimension as the outer shape and dimension of the terminal nut 31. According to the present example, the terminal nut 31 has a hexagonal shape, Consequently, the first concave portion 15a has the concave shape whose section perpendicular to its central axis 3 is hexagonal, and has the depth which is equal to the length of the outer side of the terminal nut 31. Accordingly, when the terminal nut 31 is inserted in the first concave portion 15a, the sides and bottom of the terminal nut 31 are covered with the first concave portion 15a. By the force generated by the contact between the sides and bottom of the terminal nut 31 and the walls of the first concave portion 15a, the terminal nut 31 is supported without rotating when fastening to the external bolt. In this time, the central axis 3 of the terminal nut cover 15, i.e., the first concave portion 15a almost coincides with both the central axis of the screw hole of the terminal nut 31 and the axis of the bolt inserting holes 1a and 2a of the electrode plates 1 and 2.

The second concave portion 15b is formed so that a central axis thereof can conform to that of the first concave portion 15a. The shape and dimension of the second concave portion 15b are set in such a manner that a part of the fastening bolt screw portion of the external bolt can project from a lower face 6 of the terminal nut 31 when the external bolt is threadingly engaged in and fastened to the terminal nut 31.

Figure 7:
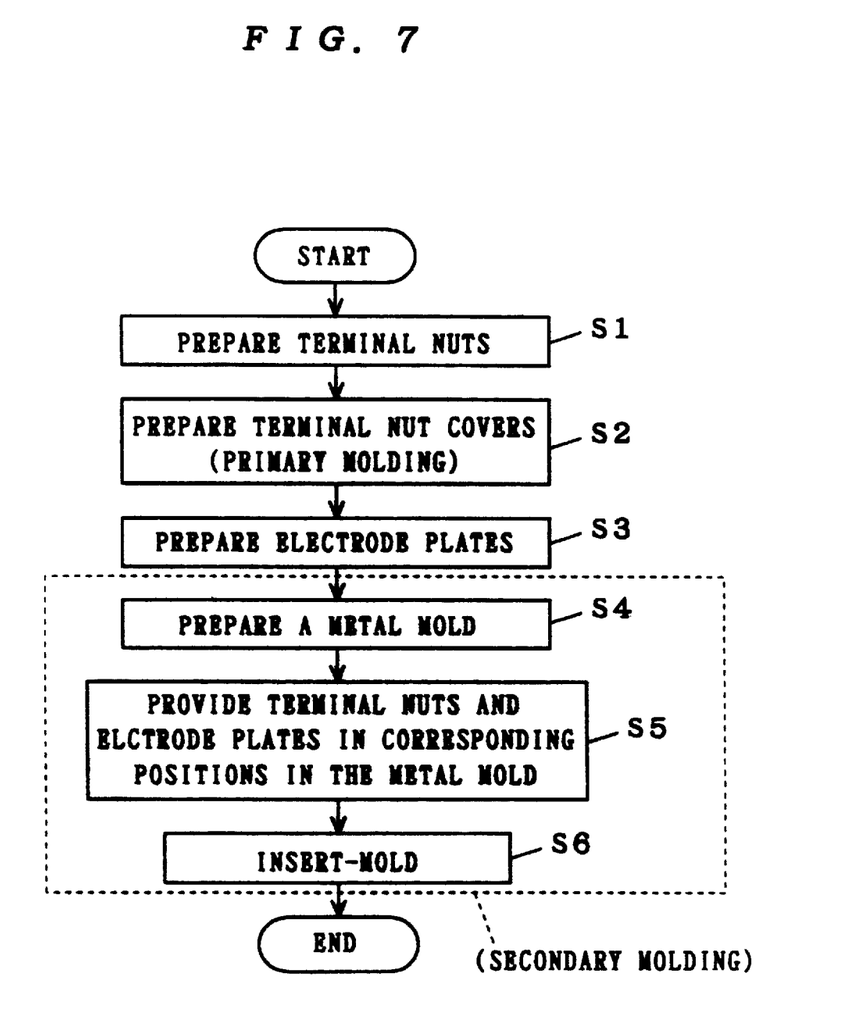
FIG. 7 is a flow chart showing the steps of manufacturing the armoring case for the power semiconductor device.

The step of manufacturing the armoring case 11 having such a structure (the previous step) will be described in detail in conjunction with FIG. 7. The same step is generally divided into a primary molding step and a secondary molding step.

First of all, the terminal nut covers 15 having the structure shown in FIGS. 1 and 2 are molded (the primary molding step).

The electrode plates 1 and 2 having the bolt inserting holes 1a and 2a formed in predetermined positions are bent into a predetermined shape by a press machine or the like, so that the tip portions 1b and 2b are formed.

Then, the secondary molding step is performed. More specifically, a metal mold for an armoring case (not shown) is prepared, in which the positions of the terminal nut covers 15 and the electrode plates 1 and 2 are set in such a manner that the central axes of the bolt inserting holes 1a and 2a of the electrode plates 1 and 2 conform to the central axes of the corresponding terminal nuts 31 respectively when the terminal nuts 31 are supported by the first concave portions 15a of the terminal nut covers 15. Each terminal nut cover 15 is first provided in the corresponding position of the metal mold, and each terminal nut 31 is then inserted in the corresponding first concave portion 15a so that each terminal nut cover 15 supports the corresponding terminal nut 31. In this case, some play is generated between the side walls of the each first concave portion 15a and each terminal nut 31. Further, the electrode plates 1 and 2 are provided in the predetermined positions of the metal mold. When these preparations are completed, the electrode plates 1 and 2 and the two terminal nut covers 15 having the terminal nuts 31 are insert-molded integrally with a resin member which should be the armoring case. Thus, the armoring case 11 having the structure shown in FIGS. 1 and 2 is molded.

When the step of manufacturing the armoring case 11 is completed, the step of assembling the power semiconductor device 10 is executed.

According to the armoring case 11 of the power semiconductor device 10 as described above, each terminal nut cover 15 is previously molded by the primary molding in such a shape that it covers the terminal nut 31 so as not to rotate when fastening the same to the fastening bolt. For this reason, when molding the armoring case 11, the resin can be prevented from flowing into the screw portions of the terminal nuts. Consequently, it is possible to previously bend the terminal portions 1b and 2b of the electrode plates 1 and 2 with high precision by the press machine or the like. In addition, the positional precision between the screw holes of the terminal nuts 31 and the fastening bolt inserting holes 1a and 2a of the electrode plates 1 and 2 can be enhanced. In the prior art, the terminal portions of the electrode plates are inserted in predetermined inserting holes and bent after molding the armoring case so that the cracks of the armoring case, misregistration, the fissures of the terminal portions and the like are caused. According to the present invention, however, it is possible to perfectly eliminate these problems.

Further, the terminal nuts 31, the electrode plates 1 and 2, and others can be assembled when molding the armoring case 11. Consequently, it is easy to automatically execute the step of assembling members around the terminals.

Also in the case where the thickness of the each electrode plate is 1.0 mm or more, the present invention can be employed. As a result, a large scale power semiconductor device can be developed.

(Second Preferred Embodiment)

Figure 3A:
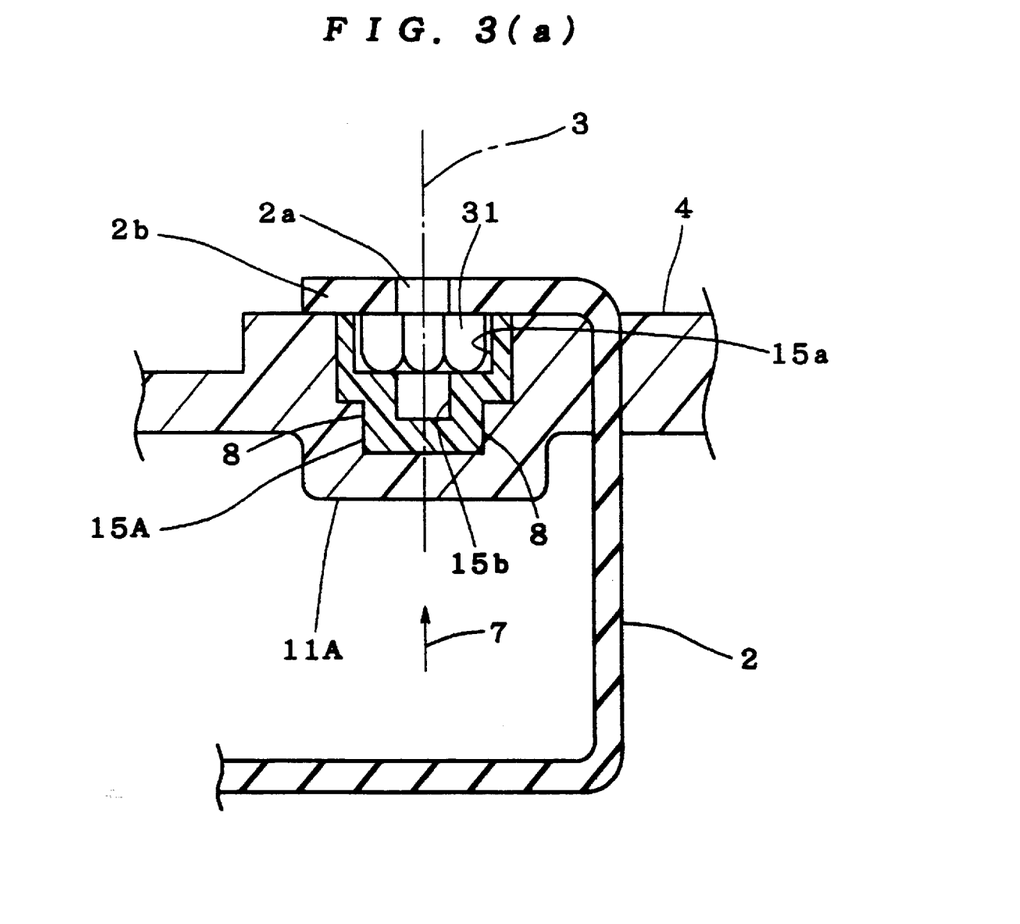
FIGS. 3a and 3b are views showing the main part of an armoring case of a power semiconductor device according to another preferred embodiment of the present invention.
Figure 3B:
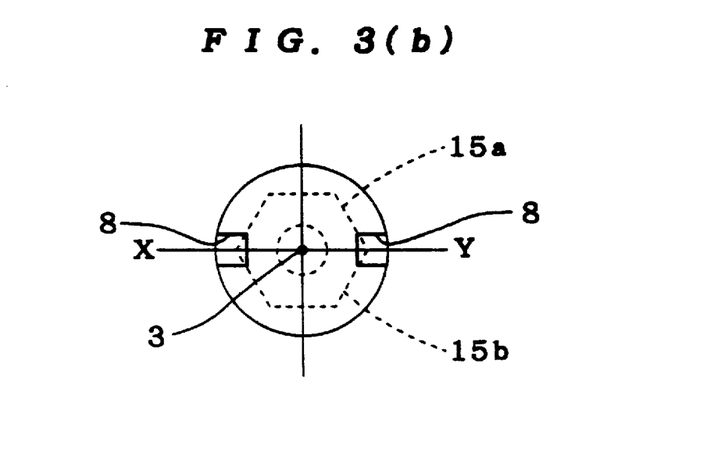

FIG. 3a is a sectional view showing the main part of an armoring frame of a power semiconductor device according to another preferred embodiment of the present invention, and corresponds to the variant of the portions in the broken lines region shown in FIG. 1. FIG. 3b is a plan view showing a terminal nut cover 15A of FIG. 3a seen in the direction of an arrow 7. The longitudinally sectional view taken along the line X-Y shown in FIG. 3b corresponds to FIG. 3a.

The second preferred embodiment is different from the first preferred embodiment in that the each terminal nut cover has a different shape. In other respects, the second preferred embodiment is the same as the first preferred embodiment.

In FIGS. 3a and 3b, the reference numeral 11A designates an armoring case and the reference numeral 15A designates a terminal nut cover. Groove portions or notch portions 8 are provided in predetermined portions where the terminal nut cover 15A is fixed to a resin of the armoring case 11A, i.e., on a part of the outer face (outer side and bottom) of the terminal nut cover 15A. Consequently, the resin for the armoring case 11A enters each of the groove portions 8 during insert-molding, so that the adhesion of the resin of the armoring case 11A to the resin which forms the terminal nut cover 15A is increased.

According to the second preferred embodiment, each terminal nut cover 15A and the armoring case 11A can be fixed more firmly each other. Consequently, the terminal nut covers 15A can be prevented from rotating against the armoring case 11A by the fastening force generated when threadingly engaging the fastening bolt in each terminal nut 31. Consequently, the terminal nuts 31 can perfectly be prevented from rotating. As a result, fastening can surely be performed by the fastening bolts.

(Third Preferred embodiment)

Figure 4:
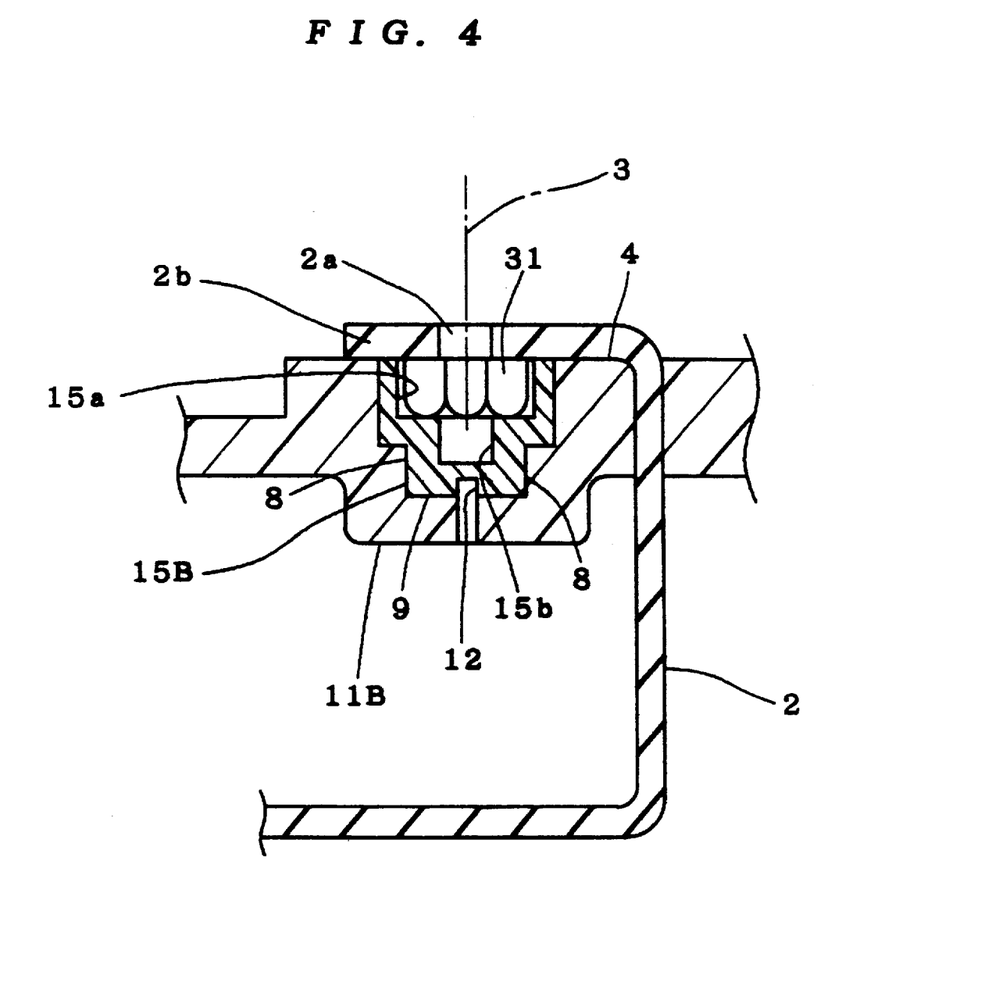
FIG. 4 is a sectional view showing the main part of an armoring case of a power semiconductor device according to yet another preferred embodiment of the present invention.

FIG. 4 is a sectional view showing the main part of an armoring case of a power semiconductor device according to yet another preferred embodiment of the present invention, in which the areas shown in broken lines in FIG. 1 are enlarged. The third preferred embodiment corresponds to the variant of the second preferred embodiment, and is different from the second preferred embodiment in the following respects.

According to an armoring case 11B shown in FIG. 4, a concave portion 12 for secondary mold positioning is provided inward from the central portion of a bottom 9 on the back side of a terminal nut cover 15B (opposite to an inserting face 4 for a terminal nut 31). The secondary mold positioning concave portion 12 is connected to a through hole which is formed in the armoring case 11B during insert-molding, and serves as a working face on a metal mold when insert-molding the armoring case 11B. More specifically, a convex portion for secondary mold positioning is previously formed on the metal mold (not shown) in correspondence with the concave portion 12. At the time of insert-molding, the convex portion is inserted in the concave portion 12 so that the terminal nut cover 15B is surely provided in the metal mold.

By using the simple structures of the terminal nut covers 15B, the desired insert-molding can surely be performed against the injection pressure of a resin for the armoring case 11B. In addition, it is possible to prevent misregistration from occurring due to the injection pressure.

The notion that the concave portion 12 is provided can also be applied to the armoring case 11 shown in FIG. 2. While the depth of the first concave portion 15a of each of the terminal nut covers 15, 15A and 15B is almost equal to the length of the side of the terminal nut 31 in the first to third preferred embodiments, it can be reduced within the range in which each terminal nut 31 does not rotate.

While the invention has been described in detail, the foregoing description is in all aspects illustrative and not restrictive. It is understood that numerous other modifications and variations can be devised without departing from the scope of the invention.

What is claimed as new and desired to be secured by letters patent of the United States is:

1. A power semiconductor device, comprising:
   an armoring case,
   said armoring case including:
     a terminal nut;
     a terminal nut cover which covers at least a lower portion of an outer side and a bottom of said terminal nut and which supports said terminal nut so as to prevent said terminal nut from rotating; and
     an electrode plate including a terminal portion which is previously bent into a predetermined shape and has a bolt inserting hole for inserting an external bolt so as to be threadingly engaged in said terminal nut, said bolt inserting hole having a central axis conforming to a central axis of a screw hole of said terminal nut,
   wherein said terminal nut cover and said electrode plate are insert-molded integrally with said armoring case.

2. The power semiconductor device according to claim 1, wherein said terminal nut cover further comprises:
   a groove portion formed on a part of an outer face thereof and embedded in said armoring case.

3. The power semiconductor device according to claim 2, wherein said terminal nut cover further comprises:
   a concave portion for secondary mold positioning formed inward from a part of a bottom thereof which is embedded in said armoring case opposite to an inserting face of said terminal nut, and
   said armoring case comprises a through hole which is formed from a face opposite to said bottom of said terminal nut cover and penetrates through said concave portion for said secondary mold positioning.

4. The power semiconductor device according to claim 1, wherein said terminal nut cover comprises:
   a first concave portion having a same shape and dimension as an outer shape and dimension of said terminal nut,
   a depth of said first concave portion is set to a value to prevent said terminal nut from rotating, and
   said terminal nut is provided in said first concave portion so as to be supported by said terminal nut cover.

5. The power semiconductor device according to claim 4, wherein said terminal nut cover further comprises:
   a second concave portion formed inward from a part of a bottom of said first concave portion,
   a central axis of said second concave portion conforms to a central axis of said first concave portion, and
   a shape and dimension of said second concave portion are set in such a manner that a bolt screw portion of said external bolt can project from said bottom of said first concave portion when threadingly engaging said external bolt in said terminal nut.

6. The power semiconductor device according to claim 5, wherein said terminal nut cover further comprises:
   a groove portion formed on a part of an outer face thereof and embedded in said armoring case.

7. The power semiconductor device according to claim 6, wherein said terminal nut cover further comprises:
   a concave portion for secondary mold positioning formed inward from a part of a bottom thereof which is embedded in said armoring case opposite to an inserting face for said terminal nut, and
   said armoring case comprises a through hole which is formed from a face opposite to said bottom of said terminal nut cover and penetrates through said concave portion for secondary mold positioning.

8. An armoring case of a power semiconductor device, comprising:
   a terminal nut cover which covers at least a lower portion of an outer side and a bottom of a terminal nut and which supports said terminal nut so as to prevent said terminal nut from rotating; and an electrode plate including a terminal portion which is previously bent into a predetermined shape and has a bolt inserting hole for inserting an external bolt so as to be threadingly engaged in said terminal nut, said bolt inserting hole having a central axis conforming to a central axis of a screw hole of said terminal nut, wherein said terminal nut cover and said electrode plate are insert-molded integrally with said armoring case.

9. The armoring case of a power semiconductor device according to claim 8, wherein a groove portion is provided on a part of an outer face of said terminal nut cover which is embedded in said armoring case.

10. The armoring case of a power semiconductor device according to claim 9, wherein a concave portion for secondary mold positioning is formed inward from a part of a bottom of said terminal nut cover which is embedded in said armoring case, and a through hole which penetrates through said concave portion for said secondary mold positioning is formed on said armoring case.

* * * * *

UNITED STATES PATENT AND TRADEMARK OFFICE
CERTIFICATE OF CORRECTION

PATENT NO. : 5,825,085
DATED      : October 20, 1998
INVENTOR(S): Toshikazu MASUMOTO, et al.

It is certified that error appears in the above-identified patent and that said Letters Patent is hereby corrected as shown below:

On the title page, Item [75], the second inventors' first name, is misspelled. It should be:

--Hisatoshy Arita--

Signed and Sealed this

Sixteenth Day of February, 1999

Attest:

*Acting Commissioner of Patents and Trademarks*

*Attesting Officer*